United States Patent
Idota et al.

(10) Patent No.: US 6,927,118 B2
(45) Date of Patent: Aug. 9, 2005

(54) METHOD OF FABRICATING A BIPOLAR TRANSISTOR UTILIZING A DRY ETCHING AND A WET ETCHING TO DEFINE A BASE JUNCTION OPENING

(75) Inventors: Ken Idota, Moriguchi (JP); Teruhito Ohnishi, Hirakata (JP); Akira Asai, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 33 days.

(21) Appl. No.: 10/695,478

(22) Filed: Oct. 29, 2003

(65) Prior Publication Data

US 2004/0092076 A1 May 13, 2004

Related U.S. Application Data (63) Continuation of application No. PCT/JP02/09569, filed on Sep. 18, 2002.

(30) Foreign Application Priority Data

Sep. 18, 2001 (JP) ........................................ 2001-283272

(51) Int. Cl.$^7$ ......................................... H01L 21/8222
(52) U.S. Cl. ........................................ 438/235; 438/312
(58) Field of Search ............................ 438/202, 207, 438/234–235, 309, 312, 322

(56) References Cited

U.S. PATENT DOCUMENTS

| | | | |
|---|---|---|---|
| 4,318,751 A | * 3/1982 | Horng | ........................ 438/374 |
| 4,879,252 A | 11/1989 | Komatsu | |
| 4,914,053 A | * 4/1990 | Matyi et al. | ................ 438/489 |
| 4,980,302 A | * 12/1990 | Shimizu | ..................... 438/363 |
| 6,455,364 B1 | * 9/2002 | Asai et al. | .................. 438/235 |
| 2004/0157387 A1 | * 8/2004 | Yi et al. | ..................... 438/202 |
| 2004/0195655 A1 | * 10/2004 | Ohnishi et al. | ............. 257/575 |
| 2004/0209418 A1 | * 10/2004 | Knoll et al. | ................ 438/202 |
| 2004/0256613 A1 | * 12/2004 | Oda et al. | ..................... 257/19 |
| 2005/0012180 A1 | * 1/2005 | Freeman et al. | ............ 257/565 |
| 2005/0048735 A1 | * 3/2005 | Khater et al. | ............... 438/400 |

FOREIGN PATENT DOCUMENTS

| | | | |
|---|---|---|---|
| EP | 0 551 185 | 7/1993 | |
| EP | 1 037 284 | 9/2000 | |
| JP | 04-184937 | 7/1992 | |
| JP | 04-245438 | 9/1992 | |
| JP | 05-175209 | 7/1993 | |
| JP | 06-177119 | 6/1994 | |
| JP | 06-349832 | 12/1994 | |
| JP | P2001-35858 | 2/2001 | |
| JP | 2002-305310 | * 10/2002 | ....... H01L/21/8222 |
| JP | 2004-241779 | * 8/2004 | ....... H01L/21/8222 |

OTHER PUBLICATIONS

D.L. Harame et al., Si/SiGe Epitaxial–Base Transistors—Part II : Process Integration and Analog Applications. IEEE 1995, pp. 469–482.*

J.A. Babcock et al., Ionizing Radiation of High–Performance SiGe HBT's Grown by UHV/CVD. IEEE 1995, pp. 1558–1566.*

* cited by examiner

Primary Examiner—Anh Duy Mai
(74) Attorney, Agent, or Firm—McDermott Will & Emery LLP (57) ABSTRACT

The present invention discloses a process of fabricating a semiconductor device comprising the steps of: forming a collector layer of a first conductivity type at a portion of a surface of a semiconductor substrate; forming a collector opening portion in a first insulating layer formed on the semiconductor substrate; epitaxially growing, on the semiconductor substrate of the collector opening portion, a semiconductor layer including a layer of a second conductivity type constituting a base layer; sequentially layering, on the semiconductor substrate, an etching stopper layer against dry etching and a masking layer against wet etching; exposing a part of the etching stopper layer by removing a part of the masking layer by means of dry etching; and by subjecting the exposed etching stopper layer to a wet etching treatment using the remaining masking layer as a mask, forming a base junction opening portion through the etching stopper layer and the masking layer.

8 Claims, 9 Drawing Sheets

METHOD OF FABRICATING A BIPOLAR TRANSISTOR UTILIZING A DRY ETCHING AND A WET ETCHING TO DEFINE A BASE JUNCTION OPENING

This is a continuation application under 35 U.S.C. 111(a) of pending prior International Application No.PCT/JP02/09569, filed on Sep. 18, 2002.

BACKGROUND OF THE INVENTION

1. Field of the Invention

The present invention relates generally to a semiconductor device and fabrication method thereof. More specifically, the present invention is directed to a method of fabricating a hetero bipolar transistor.

2. Description of the Related Art

Recently, with a view to improving high-frequency performance, the development of hetero bipolar transistors (HBTs), comprising a bipolar transistor formed on a silicon substrate and a Si/SiGe heterojunction structure incorporated into the bipolar transistor, has been accelerated.

A typical HBT of the type mentioned above comprises material having a great affinity to the general-purpose silicon process (Si substrate and SiGe layer), thereby offering significant advantages such as high integration and cost reduction. Additionally, formation and integration of an HBT and a MOS transistor (MOSFET) on a common Si substrate makes it possible to fabricate a high-performance BiCMOS device. Such a BiCMOS device has promise as a system LSI capable of finding applications in the field of communication-related technology.

Various proposals for HBTs of the $Si/Si_{1-x}Ge_x$ type have been made.

An example of conventional $Si/Si_{1-x}Ge_x$ type HBTs is set forth in Japanese Patent Kokai Publication No. (2000) 332025.

FIGS. 6–9 are views illustrating in cross section a structure of a conventional $Si/Si_{1-x}Ge_x$ type HBT.

Figure 9J:
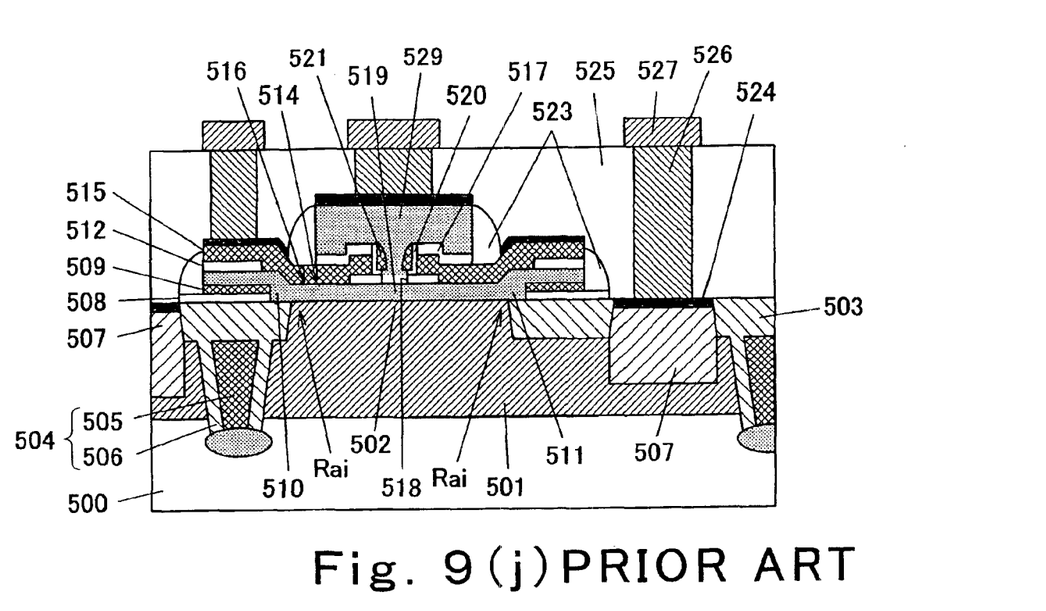
FIG. 9(j) is a schematic cross-sectional view illustrating the step in the fabrication of the conventional semiconductor device.

As shown in FIG. 9, an upper portion of an Si substrate 500 whose principle plane is (001) is a retrograde well 501 which is 1 μm deep and which contains N-type impurities (e.g., phosphor) introduced by means of epitaxial growth, ion implantation, or the like. It is controlled such that a region in the vicinity of a surface of the Si substrate 500 is doped with N-type impurities at a concentration of approximately $1\times10^{17}$ atoms·cm$^{-3}$. Additionally, a shallow trench 503 filled up with silicon dioxide and a deep trench 504 comprising an undoped polysilicon film 505 and a silicon oxide film 506 surrounding the undoped polysilicon film 505 are formed each serving as isolation. The trench 503 is approximately 0.35 μm deep. The trench 504 is approximately 2 μm deep.

A collector layer 502 is formed in a region sandwiched between trenches 503 in the Si substrate 500. On the other hand, an N$^+$ collector extraction layer 507, for establishing contact with an electrode of the collector layer 502 via the retrograde well 501, is formed in a region of the substrate that is isolated from the collector layer 502 by the shallow trench 503.

Additionally, a first deposition oxide film 508 (approximately 30 nm thick) provided with a collector opening portion 510 is formed on the Si substrate 500. And, a polysilicon layer 509 is formed overlying the first deposition oxide film 508. An $Si/Si_{1-x}Ge_x$ layer 511, which is a laminated layer of an $Si_{1-x}Ge_x$ layer (approximately 60 nm thick) doped with P-type impurities and an Si film (approximately 10 nm), is formed on a portion of an upper surface of the silicon substrate 500 exposed to the collector opening portion 510. The $Si/Si_{1-x}Ge_x$ layer 511 extends onto the polysilicon layer 509 from the entire surface of the Si substrate 500 exposed to the collector opening portion 510.

A central lower portion of the $Si/Si_{1-x}Ge_x$ layer 511 serves as an internal base 519. On the other hand, a central upper portion of the $Si/Si_{1-x}Ge_x$ layer 511 serves as an emitter layer.

Most of the $Si_{1-x}Ge_x$ layer of the $Si/Si_{1-x}Ge_x$ layer 511 is doped with P-type impurities such as boron (B) at approximately $2\times10^{18}$ atoms·cm$^{-3}$. On the other hand, the Si layer is doped by diffusion of N-type impurities (e.g., phosphor) from an N$^+$ polysilicon layer 529 with a concentration ranging from approximately $1\times10^{20}$ atoms·cm$^{-3}$ to approximately $1\times10^{17}$ atoms·cm$^{-3}$ in the direction of the depth of the substrate.

Here, it is arranged such that the edge of the shallow trench 503 is situated interior to the edge of the collector opening portion 510. As a result of such arrangement, the shallow trench 503 is located on the inward side, thereby making it possible to reduce the gross area of an HBT. However, in the case where the active region/isolation junction part Rai gets into a carrier movement region of the HBT, this causes concern for the influence of such intrusion, for example, the occurrence of a defect by stress.

Figure 7D:
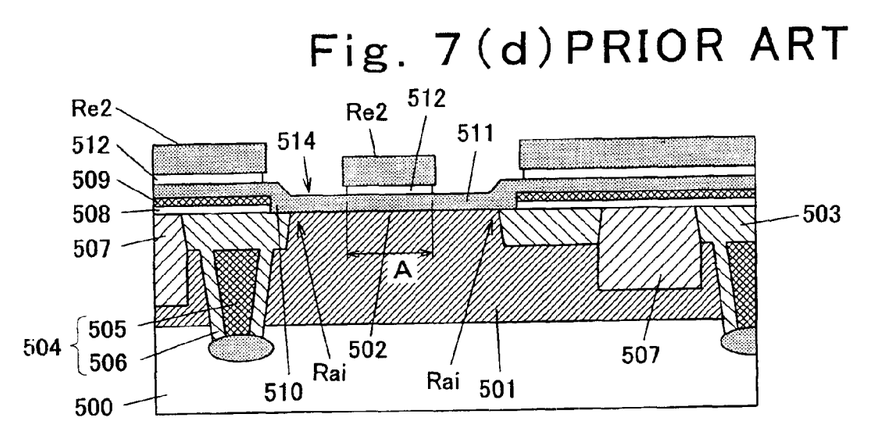
FIGS. 7(d) to 7(f) are cross-sectional views illustrating the steps in the fabrication of the conventional semiconductor device.
Figure 7E:
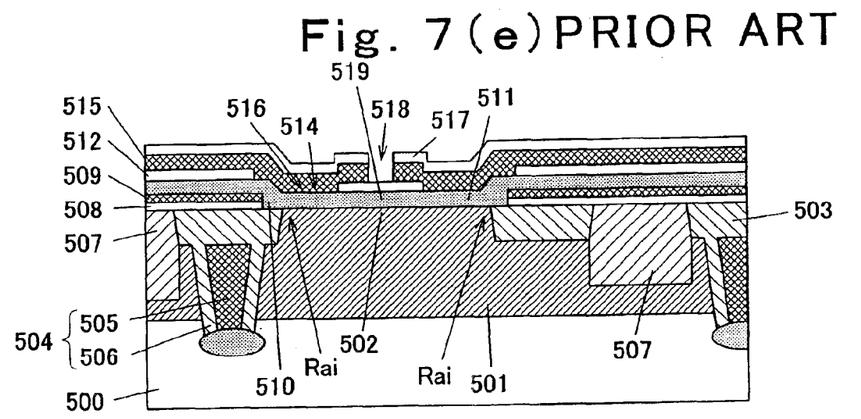
Figure 7F:
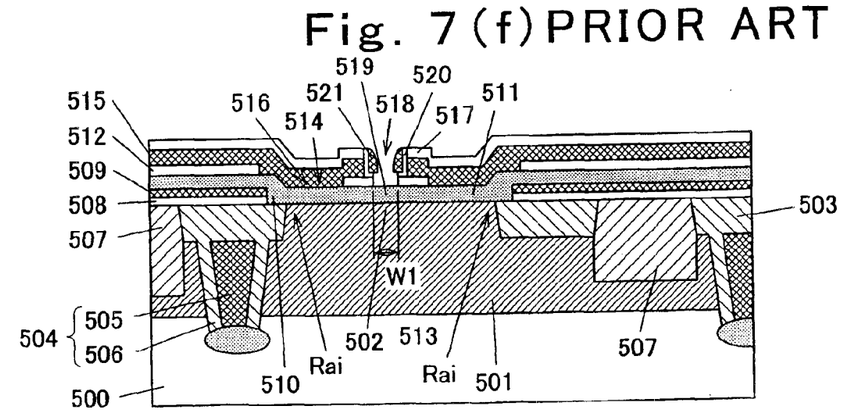

A second deposition oxide film 512 (approximately 30 nm thick) is formed, as an etching stopper, on the $Si/Si_{1-x}Ge_x$ layer 511. The second deposition oxide film 512 is provided with a base junction opening portion 514 and a base opening portion 518. The outside width, A, of the second deposition oxide film 512 around the base opening portion 518 is as shown in FIG. 7.

A P$^+$ polysilicon layer 515 (approximately 150 nm thick) filling up the base junction opening portion 514 and extending on the second deposition oxide film 512, and a third deposition oxide film 517 are formed. An extrinsic base 516 is made up of a portion of the $Si/Si_{1-x}Ge_x$ layer 511 other than a region thereof located beneath the base opening portion 518, and the P$^+$ polysilicon layer 515.

Of the P$^+$ polysilicon layer 515 and the third deposition oxide film 517, their portions located above the base opening portion 518 of the second deposition oxide film 512 are opened. A fourth deposition oxide film 520 (approximately 30 nm thick) is formed on a side surface of the P$^+$ polysilicon layer 515. Additionally, a polysilicon sidewall 521 (approximately 100 nm thick) is formed overlying the fourth deposition oxide film 520. And, an N$^+$ polysilicon layer 529 filling up the base opening portion 518 and extending on the third deposition oxide film 517 is formed. The N$^+$ polysilicon layer 529 serves as an emitter extraction electrode. The P$^+$ polysilicon layer 515 and the N$^+$ polysilicon layer 529 are electrically isolated one from the other by the fourth deposition oxide film 520, and diffusion of impurities from the P$^+$ polysilicon layer 515 into the N$^+$ polysilicon layer 529 is prevented from occurring. Furthermore, an upper surface of the P$^+$ polysilicon layer 515 and the N$^+$ polysilicon layer 529 are isolated one from the other by the third deposition oxide film 517. In addition, outer side surfaces of the N$^+$ polysilicon layer 529 and the P$^+$ polysilicon layer 515 are covered with a sidewall 523.

Furthermore, Ti silicide layers 524 are formed respectively on surfaces of the collector extraction layer 507, the P$^+$ polysilicon layer 515, and the N$^+$ polysilicon layer 529.

In addition to the above, the entire substrate is covered with an interlayer dielectric 525. Connecting holes are formed passing completely through the interlayer dielectric 525 and extending to the Ti silicide layers 524 on the N+ collector extraction layer 507, the P+ polysilicon layer 515 which is a part of the extrinsic base, and the N+ polysilicon layer 529 which is an emitter extraction electrode, respectively. And, W plugs 526 with which the connecting holes are filled up, and metallic wires 527 connected to the W plugs 526 and extending on the interlayer dielectric 525 are formed.

A process of the fabrication of a conventional HBT will now be described with reference to FIGS. 6–9.

Figure 6A:
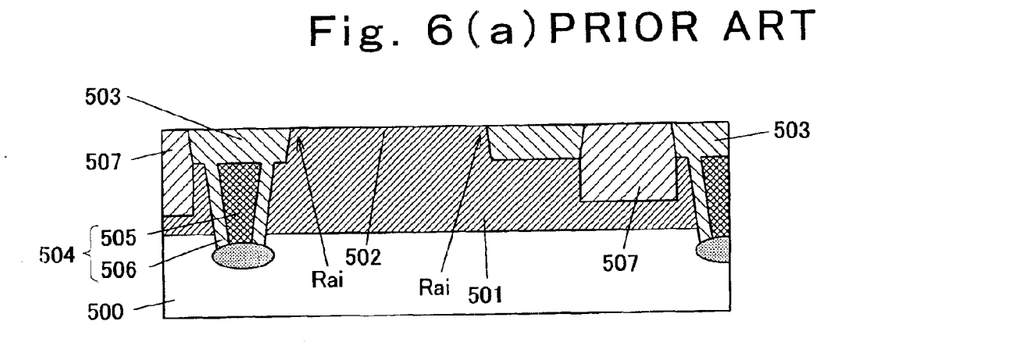
FIGS. 6(a) to 6(c) are cross-sectional views illustrating the steps in the fabrication of a conventional semiconductor device.

In the first place, in the step of FIG. 6(a), an N-type retrograde well 501 which is approximately 1 $\mu$m deep is formed either by epitaxial growth of an Si monocrystal layer upon an upper portion of an Si substrate 500 whose principal plane is (001) while performing a doping process with N-type impurities, or by performing high-energy ion implantation after epitaxial growth. Alternatively, it is possible to form such a retrograde well 501 by implanting ions into a part of the Si substrate 500 without epitaxial growth. In this case, it is controlled such that in the formation of the HBT a region in the vicinity of the surface of the Si substrate 500 is doped with N-type impurities at approximately $1 \times 10^{17}$ atoms·cm$^{-3}$ because such a region becomes a collector layer of the HBT.

Then, a shallow trench 503 filled up with silicon dioxide, and a deep trench 504 made up of an undoped polysilicon film 505 and a silicon oxide film 506 surrounding the undoped polysilicon film 505 are formed, each serving as the isolation. The trench 503 is approximately 0.35 $\mu$m deep. The trench 504 is approximately 2 $\mu$m deep. A region sandwiched between shallow trenches 503 in the Si substrate 500 becomes a collector layer 502. Additionally, an N+ collector extraction layer 507 for establishing contact with a collector electrode is formed in a region of the Si substrate 500 isolated from the collector layer 502 by the shallow trench 503.

Figure 6B:
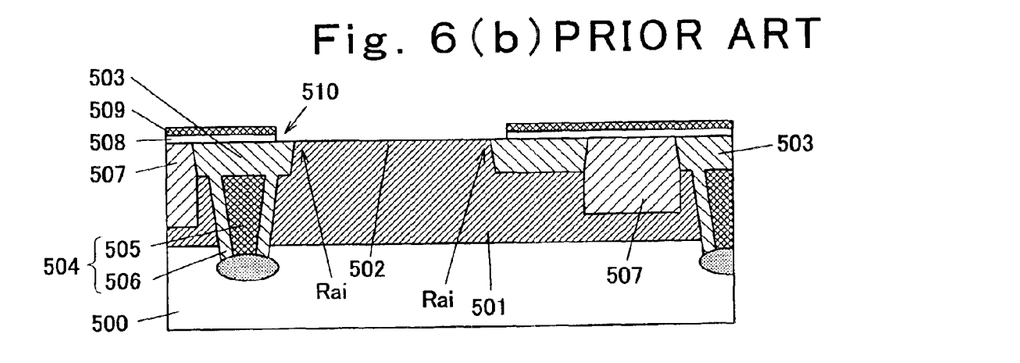

Next, in the step of FIG. 6(b), a chemical vapor deposition (CVD) treatment using tetraethyl orthosilicate (TEOS) and oxygen is carried out at a processing temperature of 680 degrees Centigrade, for formation of a first deposition oxide film 508 (approximately 30 nm thick) on the wafer. Subsequently, a polysilicon layer 509 (approximately 50 nm thick) is formed on the first deposition oxide film 508. Thereafter, the polysilicon layer 509 is patterned by means of dry etching or the like. This is followed by removal of the first deposition oxide film 508 by means of wet etching using hydrofluoric acid or the like, for formation of a collector opening portion 510.

Figure 6C:
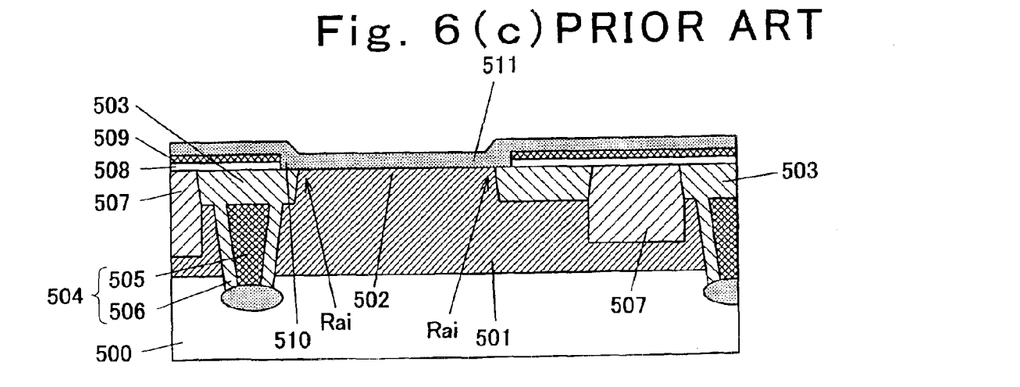

Next, in the step of FIG. 6(c), the wafer is subjected to a UHV-CVD (Ultrahigh Vacuum Chemical Vapor Deposition) treatment and, as a result, an Si$_{1-x}$Ge$_x$ layer (approximately 60 nm thick) is grown epitaxially all over a surface area of the Si substrate 500 exposed to the collector opening portion 510 and a surface of the polysilicon layer 509. And, after completion of the formation of the Si$_{1-x}$Ge$_x$ layer, an Si layer (approximately 10 nm thick) is epitaxially grown upon the Si$_{1-x}$Ge$_x$ layer. These layers, i.e., the Si$_{1-x}$Ge$_x$ and Si layers, together constitute an Si/Si$_{1-x}$Ge$_x$ layer 511. Here, the Si$_{1-x}$Ge$_x$ layer is of the P type because of introduction of boron (B) thereinto. The boron density is $2 \times 10^{18}$ atoms·cm$^{-3}$. At this time, it is arranged such that the Si layer remains undoped.

On the Si$_{1-x}$Ge$_x$ layer, a monocrystal Si layer is formed in the collector opening portion 510 and a polycrystal Si layer is formed above the polysilicon layer 509.

Next, in the step of FIG. 7(d), a second deposition oxide film 512 (30 nm thick), which will serve as an etching stopper, is formed on the wafer. Thereafter, the second deposition oxide film 512 is patterned by means of wet etching using a resist mask Re2 formed on the second deposition oxide film 512, for formation of a base junction opening portion 514. This is followed by removal of the resist mask Re2 by means of both ashing and cleaning employing a mixed liquid of sulfuric acid, oxygenated water, and water.

Next, in the step of FIG. 7(e), a P+ polysilicon layer 515 (approximately 150 nm thick and heavily doped to above $1 \times 10^{20}$ atoms·cm$^{-3}$) is deposited on the wafer by means of CVD. Then, a third deposition oxide film 517 (approximately 100 nm thick) is deposited.

Next, the third deposition oxide film 517 and the P+ polysilicon layer 515 are patterned such that a base opening portion 518 is formed centrally in the third deposition oxide film 517 and the P+ polysilicon layer 515. This base opening portion 518 reaches the second deposition oxide film 512. The base opening portion 518 is smaller in size than a central portion of the second deposition oxide film 512, so that the base opening portion 518 will not spread over the base junction opening portion 514. As the result of the FIG. 7(e) step, an extrinsic base 516 is formed by the P+ polysilicon layer 515 and a portion of the Si/Si$_{1-x}$Ge$_x$ layer 511 other than its central portion.

Next, in the step of FIG. 7(f), a fourth deposition oxide film 520 (approximately 30 nm thick) and a polysilicon film (approximately 150 nm thick) are deposited all over the wafer by means of CVD. And, the polysilicon film is etched back by means of anisotropic dry etching in such a way that a side wall 521 of polysilicon is formed on side surfaces of the P+ polysilicon layer 515 and the third deposition oxide film 517 with the fourth deposition oxide film 520 disposed between the side wall 521 and the P+ polysilicon layer 515 and the third deposition oxide film 517. Next, exposed portions of the second deposition oxide film 512 and the fourth deposition oxide film 520 are removed by means of wet etching using hydrofluoric acid or the like. At this time, an upper layer of the Si/Si$_{1-x}$Ge$_x$ layer 511, i.e., the Si layer, is exposed in the base opening portion 518. Additionally, since wet etching is an isotropic etching process, this causes the second deposition oxide film 512 and the fourth deposition oxide film 520 to be etched laterally and, as a result, the size of the base opening portion 518 is increased. Stated another way, the width, W1, of the base opening portion 518 is determined by the amount of wet etching.

Figure 8G:
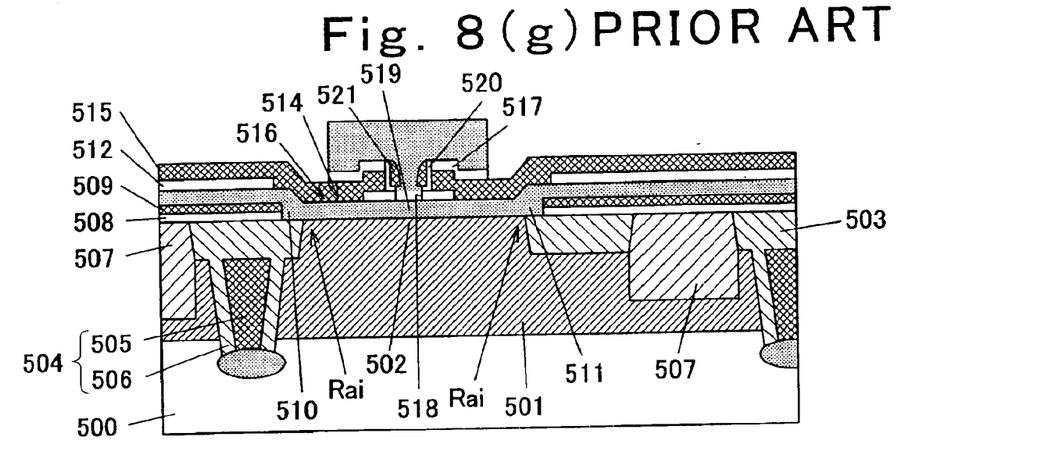
FIGS. 8(g) to 8(i) are cross-sectional views illustrating the steps in the fabrication of the conventional semiconductor device.

Next, in the step of FIG. 8(g), an N+ polysilicon layer 529 (approximately 250 nm thick) is deposited on the wafer. Thereafter, the N+ polysilicon layer 529 and the third deposition oxide film 517 are patterned by means of dry etching to form an emitter extraction electrode.

Figure 8H:
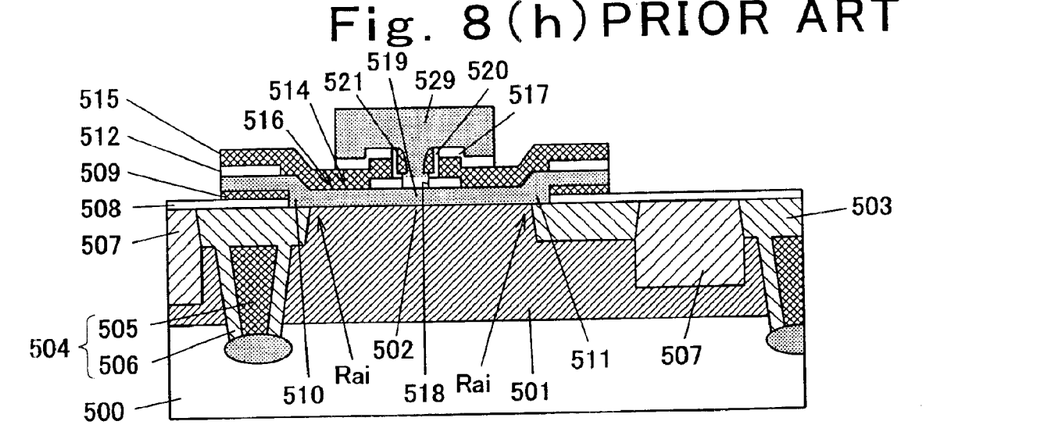

Next, in the step of FIG. 8(h), the P+ polysilicon layer 515, the second deposition oxide film 512, the Si/Si$_{1-x}$Ge$_x$ layer 511, and the polysilicon layer 509 are patterned by means of dry etching, to determine the shape of the extrinsic base 516.

Figure 8I:
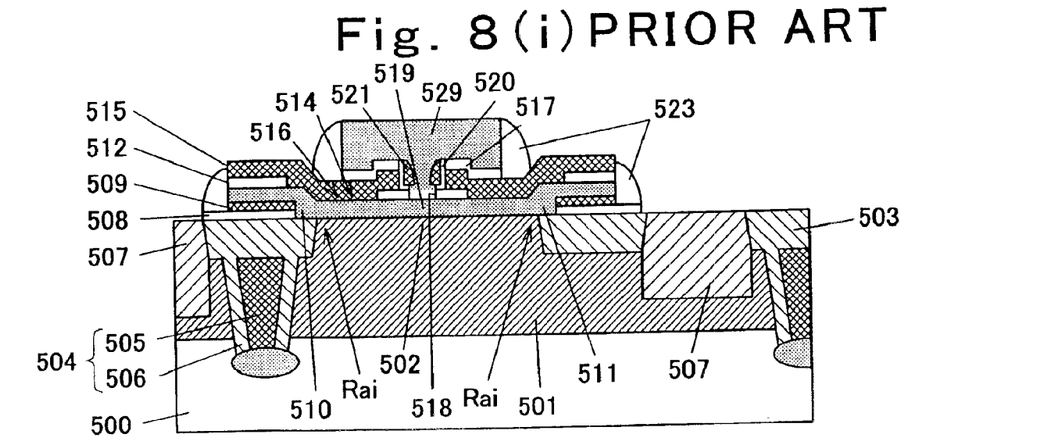

Next, in the step of FIG. 8(i), a deposition oxide film (approximately 120 nm thick) is formed on the wafer. Then, a dry etching treatment is carried out to form a side wall 523 on side surfaces of the N+ polysilicon layer 529 and the P+ polysilicon layer 515.

An exposed portion of the first deposition oxide film 508 is removed by means of the dry etching (over-etching) so that surface portions of the N+ polysilicon layer 529, the P+ polysilicon layer 515, and the N⁺ collector extraction layer 507 are exposed.

Further, the following processing will be carried out. In the first place, an approximately 40-nm thick Ti film is deposited all over the wafer by means of sputtering. Thereafter, an RTA (rapid thermal anneal) process is carried out at 675 degrees Centigrade for 30 seconds to form Ti silicide layers 524 on the exposed surface portions of the N⁺ polysilicon layer 529, the P⁺ polysilicon layer 515, and the N⁺ collector extraction layer 507, respectively. Thereafter, a portion of the Ti film remaining not reacted is selectively removed. Then, in order to change the crystal structure of the Ti silicide layer 524, annealing is carried out.

Next, an interlayer dielectric 525 is formed all over the wafer. This is followed by formation of connecting holes which pass completely through the interlayer dielectric 525 and then extend to the Ti silicide layers 524 on the N⁺ polysilicon layer 529, the P⁺ polysilicon layer 515, and the N⁺ collector extraction layer 507, respectively. And, each connecting hole is filled up with a W film to form a W plug 526. This is followed by deposition of a film of aluminum alloy all over the wafer. The aluminum alloy film is patterned to form a metallic wire 527 connected to each W plug 526 and extending on the interlayer dielectric 525.

As the result of the above-described steps, an HBT having a structure as illustrated in FIG. 9, i.e., an HBT provided with a collector made of N-type Si, a base made of the P⁺ type $Si/Si_{1-x}Ge_x$ layer 511, and an emitter made of N⁺ Si, is now fabricated. In addition, because of diffusion of high-concentration N-type impurities such as phosphorous into the Si layer of the $Si/Si_{1-x}Ge_x$ layer 511 of the HBT from the N⁺ polysilicon layer 529, the Si layer becomes an N⁺ type Si layer.

Incidentally, in the fabrication of the above-described conventional $Si/Si_{1-x}Ge_x$ HBT, in order to perform a patterning treatment with a high degree of accuracy, dry etching is employed in principle as an etching method since dry etching is superior in controllability because of its anisotropic properties. However, the $Si/Si_{1-x}Ge_x$ layer 511 is susceptible to damage when subjected to dry etching. To cope with this problem, the second deposition oxide film 512 is formed, as an etching stopper layer, directly above the $Si/Si_{1-x}Ge_x$ layer 511 and, at the time of removal of the second deposition oxide film 512, wet etching is employed since it causes less damage to the $Si/Si_{1-x}Ge_x$ layer 511. More specifically, in the fabrication step of forming the base junction opening portion as illustrated in the FIG. 7(d), at the time of pattering the second deposition oxide film 512, wet etching is employed.

However, the wet etching is an isotropic etching process, which means that the second deposition oxide film 512 is etched also in a lateral direction. As the result of this, the outside width, A, of the second deposition oxide film 512 around the base opening portion 518 is diminished. Besides, since there is entrance of etching liquid from an interface between the resist Re2 and the second deposition oxide film 512, this reduces the thickness of the second deposition oxide film 512. At the same time, such etching liquid entrance accelerates the rate of the above-mentioned lateral etching. And, if the thickness of the second deposition oxide film 512 is reduced excessively, the effect of the second deposition oxide film 512 as an etching stopper at the time of forming the base opening portion 518 will wear off.

Meanwhile, recently micro-fabrication has been demanded in the field of $Si/Si_{1-x}Ge_x$ type HBT technology. With the advancement of the HBT micro-fabrication, it is required that the amount of lateral etching to the second deposition oxide film 512 be held low.

In the above-mentioned conventional technology, however, the deposition oxide film 512 is etched laterally and the thickness of the deposition oxide film 512 is reduced, therefore producing inconvenience that the degree of micro-fabrication is limited.

In other words, in order to perform micro-fabrication on the deposition oxide film 512 with high controllability, it is required that the amount of lateral etching of the deposition oxide film 512 be held low. A simple way of achieving this may be to reduce the thickness of the deposition oxide film 512 to a further extent. The reason is that as the thickness of the deposition oxide film 512 is reduced, the amount of lateral etching of the deposition oxide film 512 decreases. In the above-mentioned conventional technology, however, the deposition oxide film 512 will become further thinner after the formation of the base junction opening portion by means of wet etching. As a result, the effect of the deposition oxide film 512 as an etching stopper will wear off.

Conversely, when the second deposition oxide film 512 is thick, the reduction in size of the width A is great, and there is a limit to the reduction in the width A.

SUMMARY OF THE INVENTION

With a view to provide solutions to the above-described problems, the present invention was made. Accordingly, an object of the invention is to provide a semiconductor device operating as a fine HBT and method of fabricating such a semiconductor device.

More specifically, in order to achieve the foregoing object, the present invention discloses a method for fabricating a semiconductor device which is formed on a semiconductor substrate and which operates as a bipolar transistor is provided with an emitter, a base, and a collector, the method comprising: a step (a) of forming the collector of a first conductivity type at a portion of a surface of the semiconductor substrate, a step (b) of forming a first insulating layer on the semiconductor substrate and subsequently forming, in a portion of the first insulating layer situated above the collector, a collector opening portion reaching the collector, a step (c) of epitaxially growing, on the semiconductor substrate, a semiconductor layer including at least a layer of a second conductivity type constituting the base, a step (d) of forming, on the semiconductor substrate, an etching stopper layer which serves as an etching stopper against dry etching and which has insulating ability and a masking layer against wet etching in such a way that the masking layer overlies the etching stopper layer, a step (e) of exposing a part of the etching stopper layer by removing a part of the masking layer by means of dry etching, a step (f) of forming a base junction opening portion reaching the semiconductor layer by subjecting the part of the etching stopper layer exposed by means of the dry etching of the step (e) to a wet etching treatment using the remaining part of the masking layer as a mask, a step (g) of layering, on the semiconductor substrate, a first conductor layer and a second insulating layer and subsequently forming a base opening portion reaching the etching stopper layer by carrying out a dry etching treatment so that the masking layer, the first conductor layer, and the second insulating layer are penetrated locally, a step (h) of forming a third insulating layer covering a side surface exposed to the base opening portion, a step (i) of exposing the semiconductor layer at the bottom of the base opening portion by removing a portion of the etching stopper layer exposed to the base opening portion by means of a wet etching treatment, and a step (j) of forming the emitter by filling up the base opening portion.

In the conventional example previously described, the second deposition oxide film serving as an etching stopper is etched (hereinafter eroded) in a thickness direction during formation of a base junction opening portion. The inventors of the present invention made a study on such erosion and found out that the cause is poor adhesion of a resist (i.e., the masking layer) to the second deposition oxide film. On the other hand, as the result of the above-disclosed arrangement of the present invention, the masking layer is formed on the etching stopper layer, thereby providing improved adhesion of the masking layer to the etching stopper layer. This makes it possible to prevent erosion of the etching stopper layer due to entrance of an etching liquid from between the masking layer and the etching stopper layer, when forming a base junction opening portion by removing the etching stopper layer by means of wet etching using the masking layer as a mask. Accordingly, only removal of a layer situated directly above the semiconductor layer that is susceptible to damage when subjected to dry etching is carried out by means of wet etching with high controllability and, on the other hand, other etching processes are carried out by dry etching superior in controllability, whereby it becomes possible to fabricate a semiconductor device operating as a fine bipolar transistor with high controllability.

The masking layer may be formed by an electrical conductor.

Furthermore, it may be arranged such that, in the step (c), as the semiconductor layer, a heterojunction semiconductor layer serving as the layer of the second conductivity type which is heterojunctioned to the collector, and an undoped emitter semiconductor layer which is heterojunctioned to the heterojunction semiconductor layer are formed, in that order, on the semiconductor substrate in the collector opening portion by epitaxial growth, and that, in the step (j), a second conductor layer doped with impurities of the first conductivity type is formed in the base opening portion, whereby the first conductivity type impurities are diffused into the emitter semiconductor layer from the second conductor layer.

Such arrangement makes the present invention particularly effective since heterojunction semiconductor layers are usually susceptible to damage when subjected to dry etching.

Additionally, the heterojunction semiconductor layer may comprise at least one of SiGe, SiGeC, and SiC.

Such arrangement makes the present invention particularly effective since these materials are susceptible to damage when subjected to dry etching.

Furthermore, it may be arranged such that, in the step (b), a reducing film including a material selected from among polysilicon, amorphous silicon, and silicon nitride is formed on the first insulating layer, and the collector opening portion is formed through portions of the reducing film and the first insulating layer situated above the collector.

Additionally, it may be arranged such that, in the step (g), a junction leak prevention layer is formed below a surface of the semiconductor layer exposed to the base junction opening portion by introducing impurities of the second conductivity type by means of an ion implantation treatment using the remaining masking layer as a mask, and the first conductor layer and the second insulating layer are layered on the semiconductor substrate. Such arrangement makes it possible to reduce leakage electric current.

The present invention discloses a semiconductor device which is formed on a semiconductor substrate and which operates as a bipolar transistor, the semiconductor device comprising: a collector of a first conductivity type formed at a portion of a surface of the semiconductor substrate; a first insulating layer so formed on the semiconductor substrate as to have, in a portion thereof situated above the collector, a collector opening portion; a semiconductor layer which is grown epitaxially on the semiconductor substrate and the first insulating layer in the collector opening portion and which includes at least a layer of a second conductivity type for constituting a base; an etching stopper layer which serves as an etching stopper against dry etching and which has insulating ability, and a masking layer against wet etching, the etching stopper layer and the masking layer being so layered sequentially above a predetermined portion of the semiconductor layer as to have a base junction opening portion; a first conductor layer covering the semiconductor layer and the masking layer in the base junction opening portion; a second insulating layer formed on a predetermined portion of the first conductor layer; a base opening portion so formed as to pass completely through the etching stopper layer, the masking layer, the first conductor layer, and the second insulating layer; a third insulating layer covering side surfaces of the masking layer, the first conductor layer, and the second insulating layer exposed to the base opening portion; and an emitter connected to a second conductor layer filling up the base opening portion.

Such arrangement makes it possible to prevent erosion of the etching stopper layer due to entrance of an etching liquid from between the masking layer and the etching stopper layer, when forming a base junction opening portion, whereby it becomes possible to fabricate, in a preferably manner, a semiconductor device operating as a fine bipolar transistor with high controllability.

Additionally, in the semiconductor device fabrication method of the present invention, it may be arranged such that the base comprises an intrinsic base and an extrinsic base, that the intrinsic base comprises a central portion of the semiconductor layer, and that the extrinsic base comprises the masking layer and a portion of the semiconductor layer other than the central portion.

Furthermore, the masking layer may comprise polysilicon.

In addition, in the semiconductor device of the present invention, it may be arranged such that the masking layer comprises a conductor, that the base comprises an intrinsic base and an extrinsic base, that the intrinsic base comprises a central portion of the semiconductor layer, and that the extrinsic base comprises the masking layer and a portion of the semiconductor layer other than the central portion. Furthermore, the masking layer may comprise polysilicon.

These objects as well as other objects, features and advantages of the present invention will become apparent to those skilled in the art from the following description with reference to the accompanying drawings.

BRIEF DESCRIPTION OF THE DRAWINGS

FIG. 5 (j) is a cross-sectional view illustrating the step in the fabrication of the semiconductor device according to the first embodiment of the present invention;

DETAILED DESCRIPTION OF PREFERRED EMBODIMENTS

Hereinafter, exemplary embodiments of the present invention will be described with reference to the drawing figures.

Embodiment 1

FIGS. 1(a)–5(j) are cross-sectional views illustrating the steps in the fabrication of an SiGe-HBT as an embodiment of the present invention.

Figure 1A:
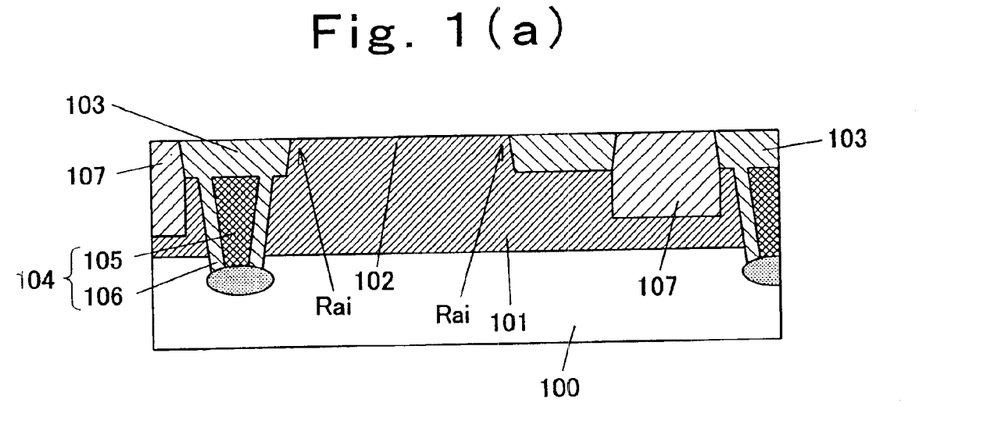
FIGS. 1(a) to 1(c) are cross-sectional views illustrating the steps in the fabrication of a semiconductor device according to a first embodiment of the present invention.

In the first place, in the step of FIG. 1(a), an Si substrate 100 having a principal plane of (001) is prepared. Either by epitaxially growing an Si monocrystal layer upon an upper face of the Si substrate 100 while performing a doping treatment with N-type impurities, or by carrying out high-energy ion implantation after epitaxial growth, an N-type retrograde well 101 (approximately 1 $\mu$m deep) is formed. However, the N-type retrograde well 101 can be formed by implanting ions locally into the Si substrate 100 without the process of epitaxial growth. In the fabrication of an HBT, a region in the vicinity of the surface of the Si substrate 100 becomes a collector layer of the HBT, therefore it is controlled such that the region is doped with N-type impurities at a concentration of approximately $1\times10^{17}$ atoms·cm$^{-3}$.

In the next place, a shallow trench 103 filled up with silicon dioxide, and a deep trench 104 composed of an undoped polysilicon film 105 and a silicon oxide film 106 surrounding the undoped polysilicon film 105 are formed as isolation. The trench 103 is approximately 0.35 $\mu$m deep. The trench 104 is approximately 2 $\mu$m deep. A region sandwiched between shallow trenches 103 in the Si substrate 100 becomes a collector layer 102. Throughout the present specification, a projection region of the sandwiched region onto the surface of the Si substrate 100 is referred to as a first predetermined region. Additionally, formed in a region isolated from the collector layer 102 by the shallow trench 103 is an N$^+$ collector extraction layer 107 for establishing contact with a collector electrode.

Figure 1B:
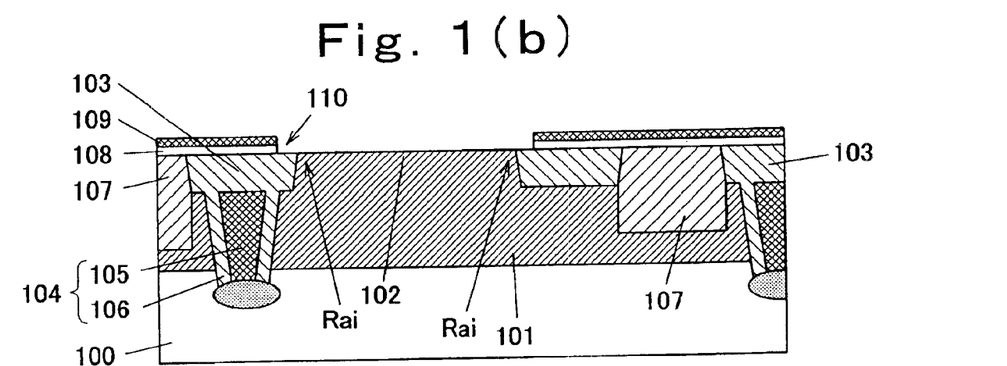

Next, in the step of FIG. 1(b), a chemical vapor deposition (CVD) treatment using tetraethyl orthosilicate (TEOS) and oxygen is carried out at a processing temperature of 680 degrees Centigrade, for formation of a first deposition oxide film 108 (approximately 30 nm thick) on the wafer. This is followed by formation of a polysilicon layer 109 (approximately 50 nm thick). Thereafter, the polysilicon layer 109 is patterned by means of, for example, dry etching. Subsequently, the first deposition oxide film 108 is etched away by means of wet etching using hydrofluoric acid or the like, for both forming a collector opening portion 110 and exposing the collector layer 102.

Figure 1C:
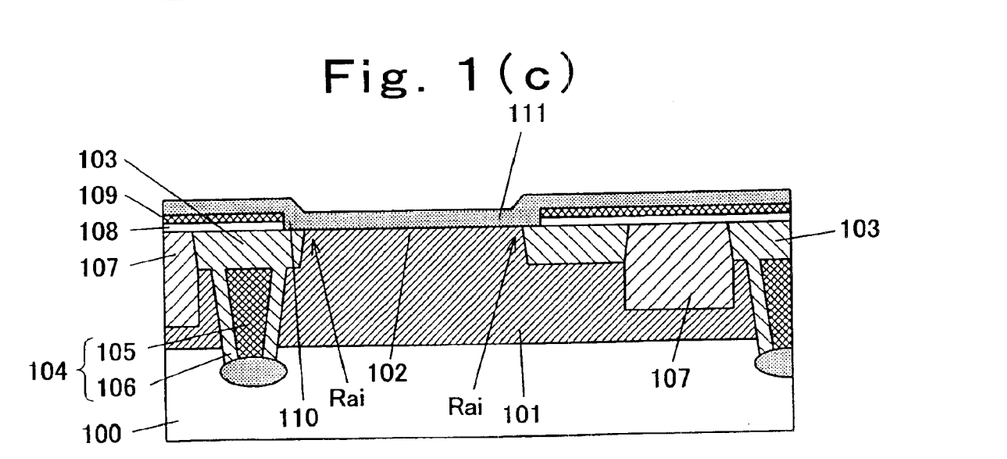

Then, in the next step of FIG. 1(c), the wafer is subjected to a UHV-CVD (Ultrahigh Vacuum Chemical Vapor Deposition) treatment in which an $Si_{1-x}Ge_x$ layer (approximately 60 nm thick) is grown epitaxially so as to extend from a surface area of the Si substrate 100 exposed to the collector opening portion 110 onto the surface of the polysilicon layer 109. And, after completion of the formation of the $Si_{1-x}Ge_x$ layer, an Si layer is epitaxially grown upon the $Si_{1-x}Ge_x$ layer to a thickness of approximately 10 nm. The $Si/Si_{1-x}Ge_x$ layer and the Si layer together constitute an $Si/Si_{1-x}Ge_x$ layer 111. Here, the $Si_{1-x}Ge_x$ layer assumes the P type because of introduction of boron (B) thereinto, and its boron concentration is $2\times10^{18}$ atoms·cm$^{-3}$. The Si layer remains undoped.

On the $Si_{1-x}Ge_x$ layer, a monocrystal Si layer is formed in the collector opening portion 110 and a polycrystal Si layer is formed above the polysilicon layer 109.

Figure 2D:
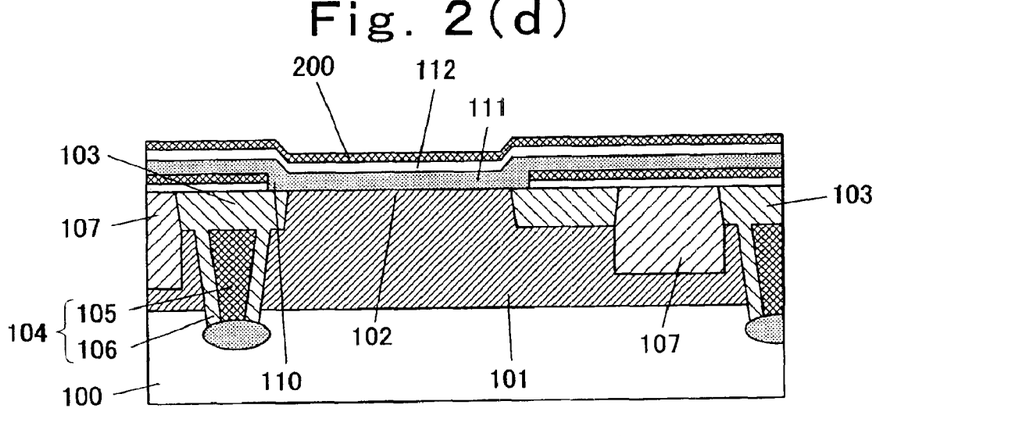
FIGS. 2(d) to (f) are cross-sectional views illustrating the steps in the fabrication of the semiconductor device according to the first embodiment of the present invention.
Figure 2E:
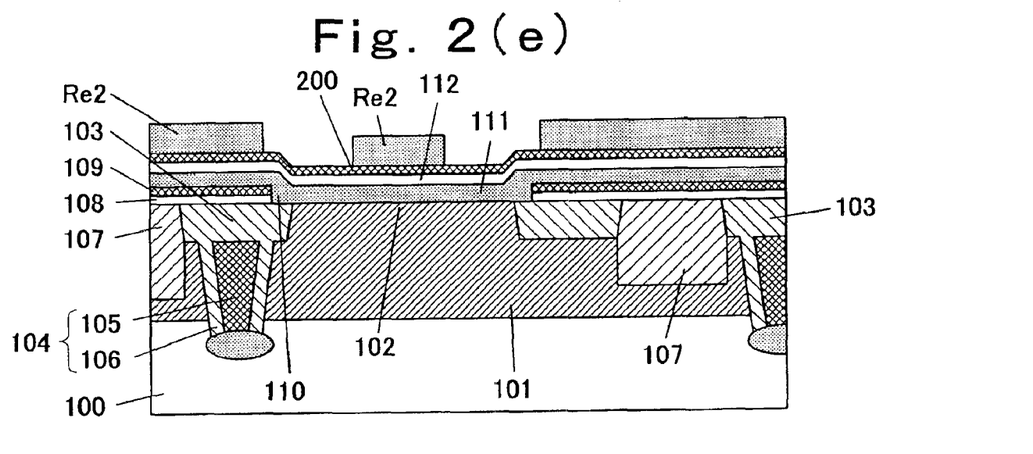
Figure 2F:
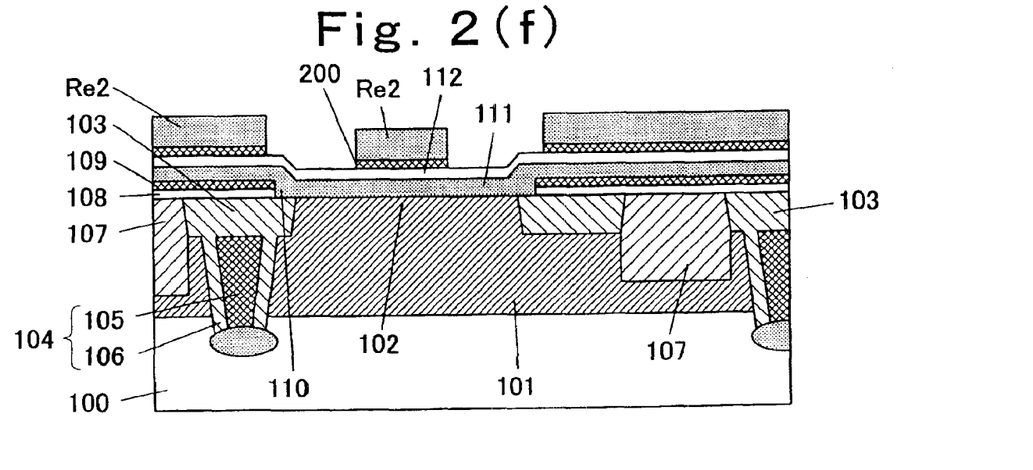

Next, in the step of FIG. 2(d), a second deposition oxide film 112 (30 nm thick) which becomes an etching stopper and a P$^+$ polysilicon layer 200 are formed sequentially on the wafer. Thereafter, in the steps of FIGS. 2(e) and (f), the P$^+$ polysilicon layer 200 is patterned by means of dry etching using a resist mask Re2 formed on the P$^+$ polysilicon layer 200. In this dry etching treatment, a mixed gas of, for example, hydrogen bromide (HBr) and chlorine (Cl$_2$) is used as an etching gas.

Figure 3G:
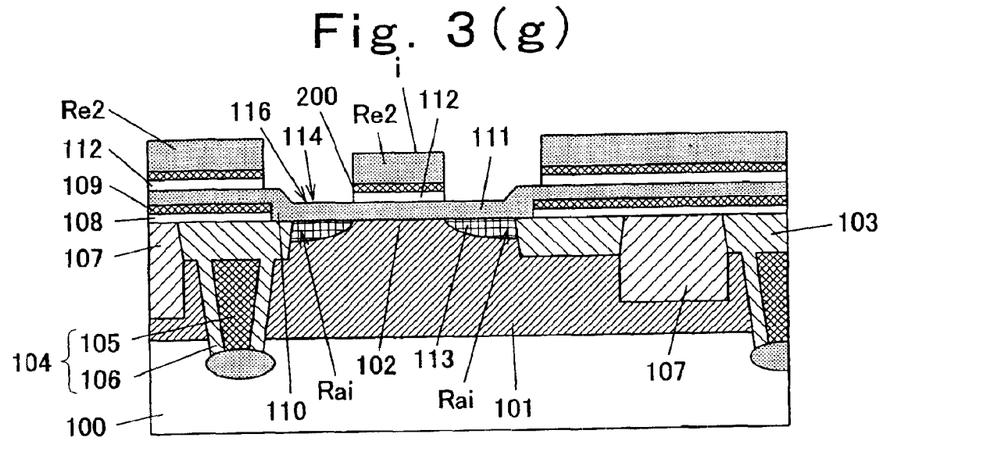
FIGS. 3(g) to (i) are cross-sectional views illustrating the steps in the fabrication of the semiconductor device according to the first embodiment of the present invention.

Then, in the step of FIG. 3(g), using the patterned P$^+$ polysilicon layer 200 as a mask, the second deposition oxide film 112 is patterned by means of wet etching to form a base junction opening portion 114.

In this wet etching treatment, buffered hydrofluoric acid (which is a mixture of hydrofluoric acid (HF) and a liquid solution of ammonium fluoride) is used as etching liquid.

The description has been made mainly by making reference to the cross-sectional views. However, in practice, when subjecting the P$^+$ polysilicon layer 200 and the second deposition oxide film 112 to an etching treatment, in order to leave an island i of FIG. 3(g) the P$^+$ polysilicon layer 200 and the second deposition oxide film 112 located around the island i are etched away. In the present specification, a projection region of the island i onto the surface of the Si substrate 100 is referred to as a second predetermined region.

In order to suppress the effect of stress in an active region/isolation junction Rai, ion implantation of P-type impurities such as boron (B) is carried out using the resist mask Re2 which was used to form the base junction opening portion 114, to form a junction leak prevention layer 113 having a concentration of approximately $3\times10^{17}$ atoms·cm$^{-3}$ in the vicinity of the surface thereof.

Figure 3H:
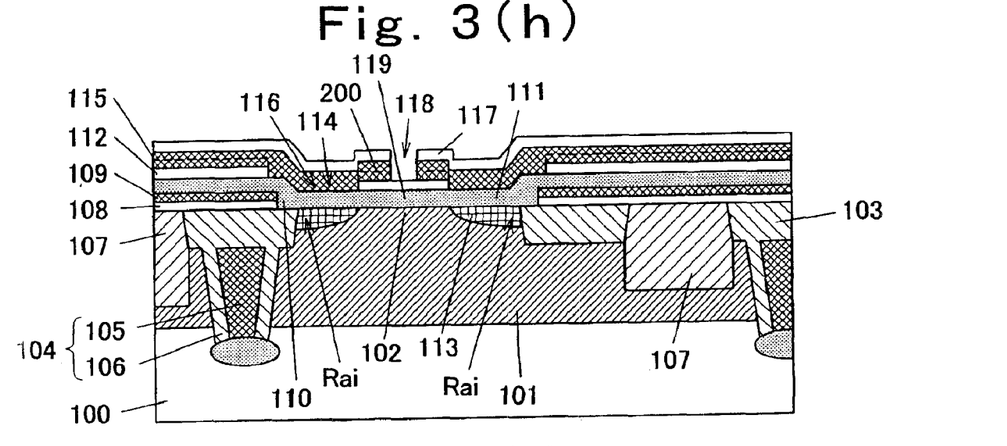

Next, in the step of FIG. 3(h), a P$^+$ polysilicon layer 115, heavily doped to a concentration in excess of $1\times10^{20}$ atoms·cm$^{-3}$, is deposited to a thickness of approximately 150 nm on the wafer by means of CVD. This is followed by deposition of a third deposition oxide film 117 (approximately 100 nm thick).

Next, the third deposition oxide film 117, the P$^+$ polysilicon layer 115, and the P$^+$ polysilicon layer 200 are patterned by means of dry etching so that a base opening portion 118 is formed passing centrally through the third deposition oxide film 117, the P$^+$ polysilicon layer 115, and the P$^+$ polysilicon layer 200 and extending to the second deposition oxide film 112. As the result of this, the second deposition oxide film 112 is exposed at the bottom of the base opening portion 118. As an etching gas to dry etch the third deposition oxide film 117, a mixed gas prepared by addition of methane trifluoride (CHF$_3$) to a gas of oxygen (O$_2$) is employed. On the other hand, as an etching gas to dry etch the P$^+$ polysilicon layers 115 and 200, a mixed gas of hydrogen bromide (HBr) and chlorine (Cl$_2$) is employed. The base opening portion 118 is smaller in size than a central portion of the second deposition oxide film 112 and, accordingly, the base opening portion 118 will not extend over the base junction opening portion 114. As the result of the present step, an extrinsic base 116 is formed by the P$^+$ polysilicon layer 515 and a portion of the Si/Si$_{1-x}$Ge$_x$ layer 111 other than the central portion thereof.

Figure 3I:
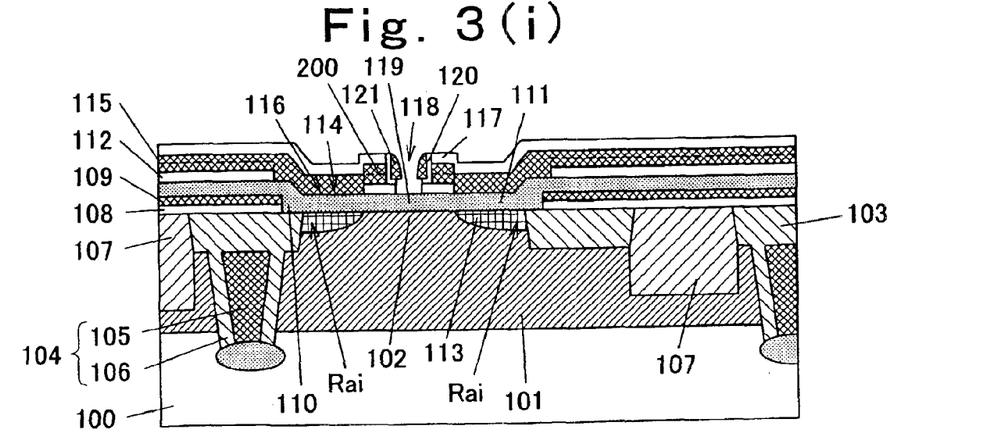

Then, in the step of FIG. 3(*i*), a fourth deposition oxide film 120 (approximately 30 nm thick) and a polysilicon film (approximately 150 nm thick) are deposited all over the wafer by means of CVD. And the polysilicon film is etched back by anisotropic dry etching so that a side wall 121 of polysilicon is formed on side surfaces of the P$^+$ polysilicon layer 115, the P$^+$ polysilicon layer 200, and the third deposition oxide film 117 with the fourth deposition oxide film 120 deposited between the side wall 121 and the P$^+$ polysilicon layer 115, the P$^+$ polysilicon layer 200, and the third deposition oxide film 117. Next, exposed portions of the second deposition oxide film 112 and the fourth deposition oxide film 120 are removed by means of wet etching using dilute hydrofluoric acid (HF concentration: 1%). At this time, an upper layer of the Si/Si$_{1-x}$Ge$_x$ layer 111, i.e., the Si layer, is exposed in the base opening portion 118. Additionally, the wet etching is isotropic, therefore the second deposition oxide film 112 and the fourth deposition oxide film 120 are etched in a lateral direction, thereby increasing the size of the base opening portion 118.

Figure 4J:
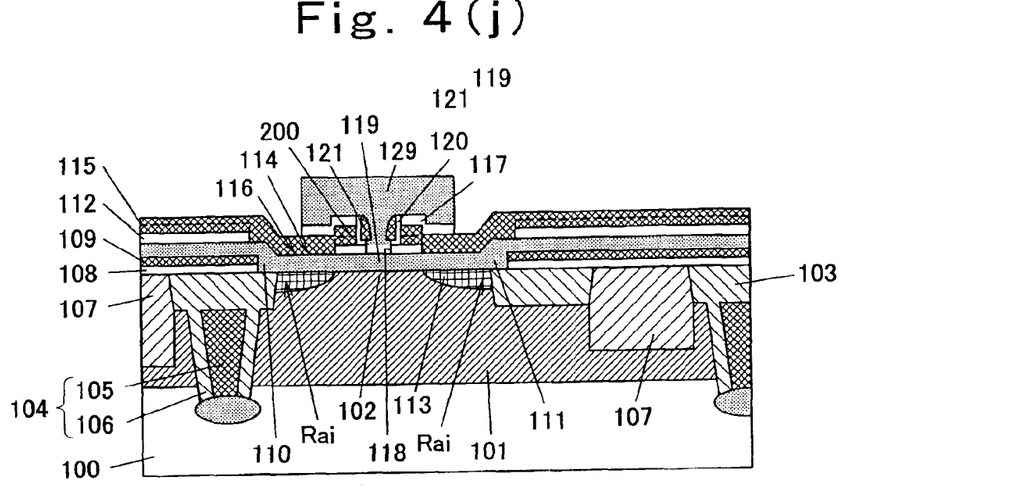
FIGS. 4(j) to (l) are cross-sectional views illustrating the steps in the fabrication of the semiconductor device according to the first embodiment of the present invention.

Next, in the step of FIG. 4(*j*), an N$^+$ polysilicon layer 129 is deposited to a thickness of approximately 250 nm on the wafer and, thereafter, an emitter extraction electrode is formed by dry etch patterning of the N$^+$ polysilicon layer 129 and the third deposition oxide film 117.

Figure 4K:
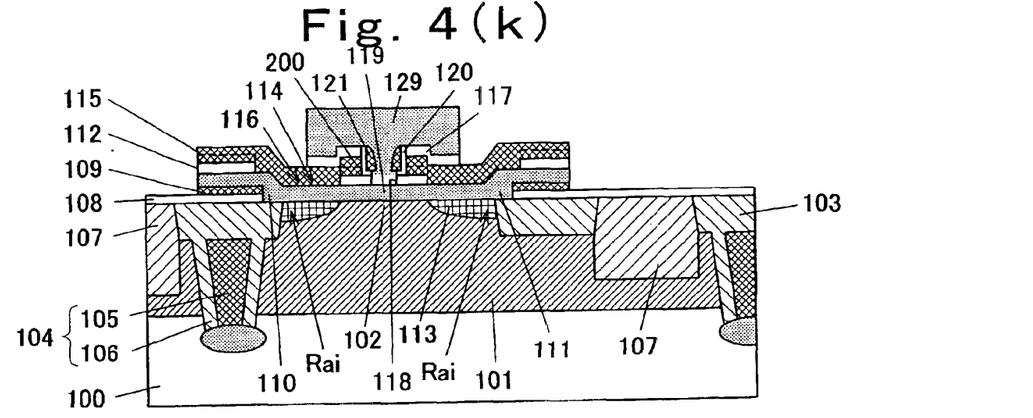

Subsequently, in the step of FIG. 4(*k*), the P$^+$ polysilicon layer 115, the second deposition oxide film 112, the Si/Si$_{1-x}$Ge$_x$ layer 111, and the polysilicon layer 109 are patterned by means of dry etching to determine the shape of the extrinsic base 116.

Figure 4L:
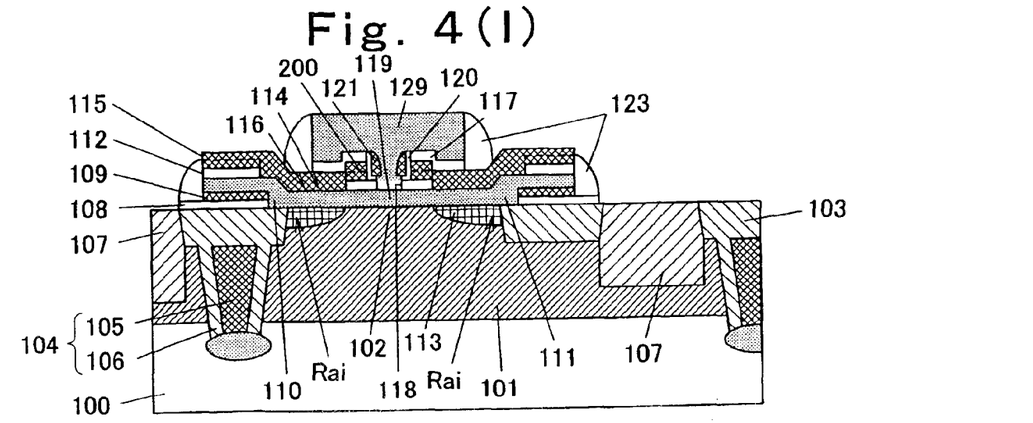

Next, in the step of FIG. 4(*l*), a deposition oxide film (approximately 120 nm thick) is formed on the wafer and, thereafter, a side wall 123 is formed on side surfaces of the N$^+$ polysilicon layer 129 and the P$^+$ polysilicon layer 115 by means of dry etching.

An exposed portion of the first deposition oxide film 108 is removed by means of the dry etching (over-etching) so that the N$^+$ polysilicon layer 129, the P$^+$ polysilicon layer 115, and the N$^+$ collector extraction layer 107 are exposed at their respective surfaces.

Figure 5J:
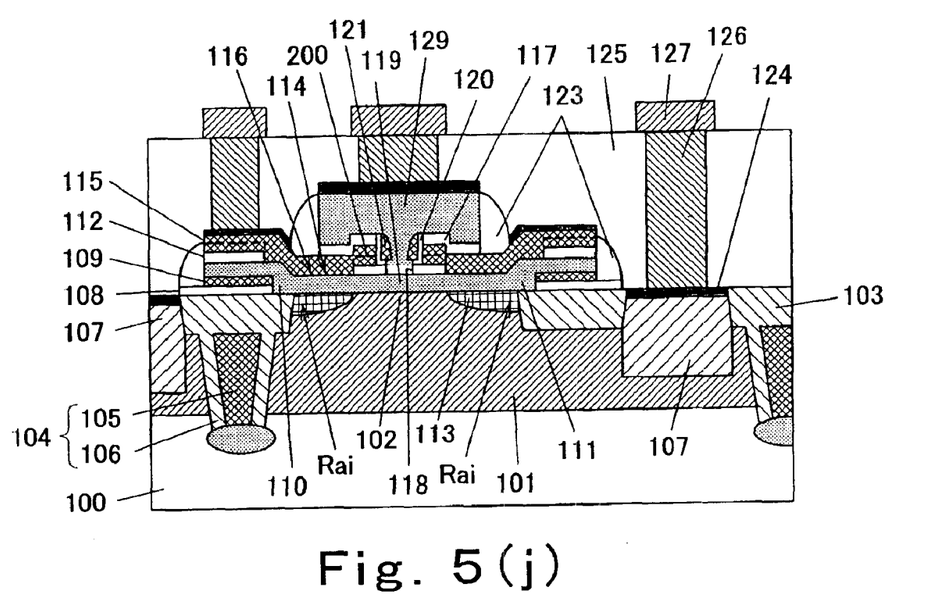

Further, the following treatments are carried out in order to obtain a structure depicted in FIG. 5(*j*). Firstly, a Ti film is deposited to a thickness of approximately 40 nm all over the wafer by means of sputtering. Thereafter, Ti silicide layers 124 are formed, by RTA (rapid thermal anneal) of 675 degrees Centigrade and 30 seconds, on the exposed surface areas of the N$^+$ polysilicon layer 129, the P$^+$ polysilicon layer 115, and the N$^+$ collector extraction layer 107. Thereafter, only a portion of the Ti film that has remained unreacted is selectively removed. Then, an annealing treatment for changing the crystal structure of the Ti silicide layers 124 is carried out.

Next, an interlayer dielectric 125 is formed all over the wafer. Connecting holes are formed passing completely through the interlayer dielectric 125 and extending to each Ti silicide layer 124 on the N$^+$ polysilicon layer 129, the P$^+$ polysilicon layer 115, and the N$^+$ collector extraction layer 107. And, each connecting hole is filled up with a W film to form a W plug 126. Thereafter, a film of aluminum alloy is deposited all over the wafer. The aluminum alloy film is patterned to form a metallic wire 127 connected to a respective W plug 126 and extending on the interlayer dielectric 125.

As the result of the above-described steps, an HBT having a structure as shown in FIG. 5 (i.e., an HBT provided with a collector made of N-type Si, a base made of the P$^+$ type Si/Si$_{1-x}$Ge$_x$ layer 111 and an emitter made of N$^+$ type Si) is fabricated. High-concentration N-type impurities such as phosphorous are diffused into the Si layer of the Si/Si$_{1-x}$Ge$_x$ layer 111 of the HBT from the N$^+$ polysilicon layer 129. Therefore, the Si layer is an N$^+$ type Si layer.

In accordance with the present embodiment, since the P$^+$ polysilicon layer 200 is formed on the second deposition oxide film 122, this improves adhesion of the P$^+$ polysilicon layer 200 to the second deposition oxide film 112. This accordingly prevents entrance of etching liquid into a clearance between the P$^+$ polysilicon layer 200 and the deposition oxide film 112 during formation of a base junction opening portion by removal of the deposition oxide film 112 by means of wet etching using the P$^+$ polysilicon layer 200 as a mask, whereby the deposition oxide film 112 will not be eroded. As a result, only a layer lying immediately above the Si/Si$_{1-x}$Ge$_x$ layer 111 which is easily damaged by dry etching is removed by means of wet etching with high controllability and other etching treatments can be carried out by means of dry etching superior in controllability. This makes it possible to fabricate a fine HBT with high controllability.

In the present embodiment, the masking layer against wet etching (i.e., the P$^+$ polysilicon layer 200) is formed of the same material as the P$^+$ polysilicon layer 115 which serves as a contact layer to the base layer. However, the masking layer may be formed of a different material. Additionally, the masking layer is formed by an electrically conductive P$^+$ polysilicon layer, but it may be formed by an insulating layer.

There are requirements for the masking layer, such as a certain degree of selective etching to the etching stopper layer 112 when performing a dry etching treatment using the resist mask Re2 and resistance to erosion when subjected to wet etching. As a material capable of meeting these requirements, amorphous silicon may be used in addition to polysilicon.

Furthermore, in the present embodiment, the etching stopper layer against dry etching is formed by the deposition oxide film 112. There are requirements for the etching stopper layer, such as selective etching to the masking layer 200 when forming the base junction opening portion 114 and selective etching to the conductor layer 115 when forming the base opening portion 118. Resistance to erosion when subjected to dry etching is, of course, a prerequisite for the etching stopper layer. As a material capable of meeting these requirements, a film of silicon oxide (SiO$_2$), a film of silicon nitride (SiN$_x$), a film of metal oxide (hafnium oxide (HfO$_2$)), a film of zirconium oxide (ZrO$_2$), a film of lanthanum oxide (La$_2$O$_3$), a film of aluminum oxide (Al$_2$O$_3$), or a film of titanium oxide (TiO$_2$) may be used. In the case where either a film of silicon oxide (SiO$_2$) or a film of metal oxide is employed, a solution of a chemical of the hydrofluoric acid family is used in a wet etching treatment. Additionally, in the case where a film of silicon nitride (SiN$_x$) is employed, thermal phosphoric acid is used in a wet etching treatment. In such a case, it is required that wet etching at the time of formation of the base opening portion 118 be divided into two stages, namely, a first stage using a solution of a chemical of the hydrofluoric acid family and a second stage using thermal phosphoric acid, or it is required that the insulating layer 120 be formed by a silicon nitride layer.

Embodiment 2

A film of a Si-containing material different from Si, such as a layer of $Si_{1-x-y}Ge_xC_y$ ($0 \leq x+y \leq 1$) or a layer of $Si_{1-y}C_y$ ($0 \leq y \leq 1$), may be used in place of the $Si_{1-x}Ge_x$ layer of the first embodiment. Alternatively, a film comprising lamination of not less than two of a layer of $Si_{1-x}Ge_x$, a layer of $Si_{1-x-y}Ge_xC_y$, a layer of $Si_{1-y}C_y$, and other layers may be used.

By virtue of the use of the foregoing various materials, strain acting on the semiconductor layer is suppressed, thereby improving the reliability of semiconductor devices to be fabricated and reducing leakage current.

The bipolar transistors of the foregoing embodiments are not necessarily limited to hetero bipolar transistors, the reason for which is that, in the case where semiconductor layers for forming base and emitter layers are made of material that is easily damaged by dry etching and microfabrication processing is required, the same problems that hetero bipolar transistors suffer will occur. Besides, the reduction in transistor area and the reduction in junction leak are required also in bipolar transistors using an Si layer which is a homo epitaxially grown film as a base.

Numerous modifications and alternative embodiments of the invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the sprit of the invention and all modifications which come within the scope of the appended claims are reserved.

What is claimed is:

1. A method for fabricating a semiconductor device which is formed on a semiconductor substrate and which operates as a bipolar transistor provided with an emitter, a base, and a collector, said method comprising:
    a step (a) of forming said collector of a first conductivity type at a portion of a surface of said semiconductor substrate,
    a step (b) of forming a first insulating layer on said semiconductor substrate and subsequently forming, in a portion of said first insulating layer situated above said collector, a collector opening portion reaching said collector,
    a step (c) of epitaxially growing, on said semiconductor substrate, a semiconductor layer including at least a layer of a second conductivity type constituting said base,
    a step (d) of forming, on said semiconductor substrate, an etching stopper layer which serves as an etching stopper against dry etching and which has insulating ability and a masking layer against wet etching in such a way that said masking layer overlies said etching stopper layer,
    a step (e) of exposing a part of said etching stopper layer by removing a part of said masking layer by means of dry etching,
    a step (f) of forming a base junction opening portion reaching said semiconductor layer by subjecting said part of said etching stopper layer exposed by means of said dry etching of said step (e) to a wet etching treatment using the remaining part of said masking layer as a mask,
    a step (g) of layering, on said semiconductor substrate, a first conductor layer and a second insulating layer and subsequently forming a base opening portion reaching said etching stopper layer by carrying out a dry etching treatment so that said masking layer, said first conductor layer, and said second insulating layer are penetrated locally,
    a step (h) of forming a third insulating layer covering a side surface exposed to said base opening portion,
    a step (i) of exposing said semiconductor layer at the bottom of said base opening portion by removing a portion of said etching stopper layer exposed to said base opening portion by means of a wet etching treatment, and
    a step (j) of forming said emitter by filling up said base opening portion.

2. The semiconductor device fabrication method as claimed in claim 1 wherein:
    said masking layer is formed by an electrical conductor.

3. The semiconductor device fabrication method as claimed in claim 1 wherein:
    in said step (c), as said semiconductor layer, a heterojunction semiconductor layer serving as said layer of the second conductivity type which is heterojunctioned to said collector, and an undoped emitter semiconductor layer which is heterojunctioned to said heterojunction semiconductor layer are formed, in that order, on said semiconductor substrate in said collector opening portion by epitaxial growth, and
    in said step (j), a second conductor layer doped with impurities of said first conductivity type is formed in said base opening portion, whereby said first conductivity type impurities are diffused into said emitter semiconductor layer from said second conductor layer.

4. The semiconductor device fabrication method as claimed in claim 3 wherein:
    said heterojunction semiconductor layer comprises at least one of SiGe, SiGeC, and SiC.

5. The semiconductor device fabrication method as claimed in claim 1 wherein:
    in said step (b), a reducing film including a material selected from among polysilicon, amorphous silicon, and silicon nitride is formed on said first insulating layer, and said collector opening portion is formed through portions of said reducing film and said first insulating layer situated above said collector.

6. The semiconductor device fabrication method as claimed in claim 1 wherein:
    in said step (g), a junction leak prevention layer is formed below a surface of said semiconductor layer exposed to said base junction opening portion by introducing impurities of said second conductivity type by means of an ion implantation treatment using said remaining masking layer as a mask, and said first conductor layer and said second insulating layer are layered on said semiconductor substrate.

7. The semiconductor device fabrication method as claimed in claim 2 wherein:
    said base comprises an intrinsic base and an extrinsic base,
    said intrinsic base comprises a central portion of said semiconductor layer, and
    said extrinsic base comprises said masking layer and a portion of said semiconductor layer other than said central portion.

8. The semiconductor device fabrication method as claimed in claim 7 wherein:
    said masking layer comprises polysilicon.

* * * * *